United States Patent [19]
Deas

[11] Patent Number: 5,896,451
[45] Date of Patent: Apr. 20, 1999

[54] ADAPTIVE TELEPHONE INTERFACE

[75] Inventor: Alexander Roger Deas, Edinburgh, United Kingdom

[73] Assignee: Jabra Corporation, San Diego, Calif.

[21] Appl. No.: 08/718,370

[22] PCT Filed: Mar. 29, 1995

[86] PCT No.: PCT/GB95/00716

§ 371 Date: Sep. 25, 1996

§ 102(e) Date: Sep. 25, 1996

[87] PCT Pub. No.: WO95/26604

PCT Pub. Date: Oct. 5, 1995

[30] Foreign Application Priority Data

Mar. 29, 1994 [GB] United Kingdom ............... 9406224

[51] Int. Cl.$^6$ .................................................. H04M 9/00
[52] U.S. Cl. .................... 379/387; 379/390; 379/391; 379/395; 379/442; 379/447
[58] Field of Search ....................... 379/387, 390, 379/391, 408, 441, 442, 450, 447

[56] References Cited

U.S. PATENT DOCUMENTS

| | | |
|---|---|---|
| 4,306,113 | 12/1981 | Morton . |
| 4,782,524 | 11/1988 | McQuinn et al. . |
| 4,879,746 | 11/1989 | Young et al. . |
| 4,975,949 | 12/1990 | Wimsatt et al. . |
| 5,058,155 | 10/1991 | Larsen . |

FOREIGN PATENT DOCUMENTS

| | | |
|---|---|---|
| 0 193 733 | 9/1986 | European Pat. Off. . |
| 0 459 405 | 12/1991 | European Pat. Off. . |

OTHER PUBLICATIONS

"Anticlipping" verbessert elektronische Sprechschaltung, pp. 88–93, by Dipl. –Ing. Michael Follner and Dipl. –Ing. Mario Bollinger, Jul. 22, 1988.

Primary Examiner—Fan S. Tsang
Assistant Examiner—Shih-Wen Hsieh
Attorney, Agent, or Firm—Alston & Bird

[57] ABSTRACT

The present invention relates to an adaptive telephone interface for use in a telephone apparatus comprising a telephone terminal including signal amplifier means, and audio/input device. The telephone interface is disposable between the terminal and the audio/input device, and comprises a processor for generating a test signal and sending this to the terminal at a plurality of different amplitudes. The processor is further formed and arranged for monitoring signals returned from the terminal by means of sidetone coupling, so as to identify the test signal amplitude at which clipping of at least part of the test signal occurs, and consequentially adjusting the amplification by the interface of a signal received from the audio input device, before sending it on to the terminal so as to avoid substantially clipping thereof by the terminal signal amplifier means in use of the telephone apparatus.

21 Claims, 1 Drawing Sheet

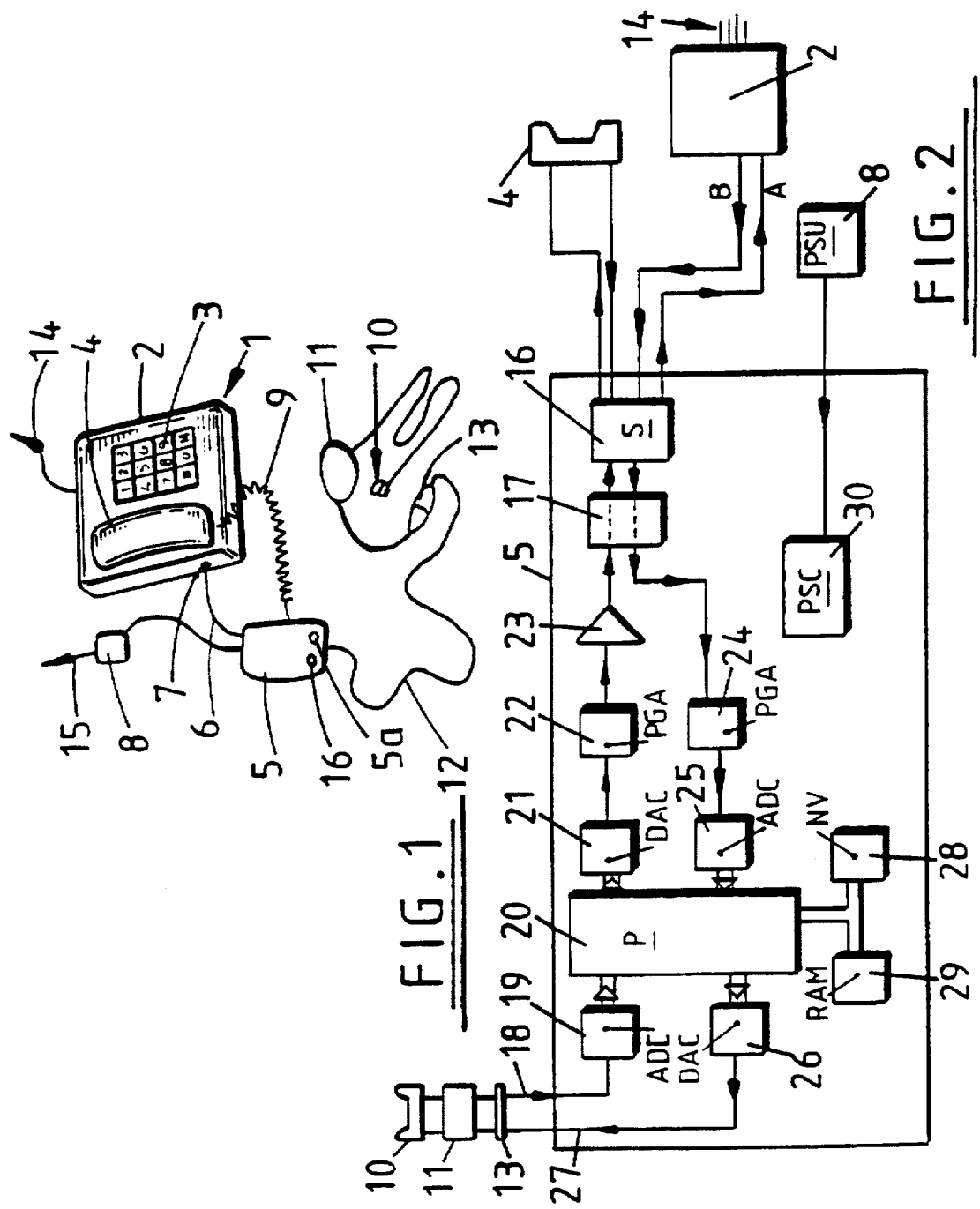

ADAPTIVE TELEPHONE INTERFACE

FIELD OF THE INVENTION

The present invention relates to an adaptive telephone interface and is applicable in particular, though not exclusively, to interfacing between telephone terminals and audio input/output devices such as headsets. As used herein a telephone terminal is generally a unit with a numeric or alphanumeric keypad and is commonly connected to a telephone handset containing a microphone and an earphone loudspeaker. Traditionally the user would lift the handset and then type a number into the terminal.

BACKGROUND OF THE INVENTION

It is an increasingly common requirement in communications to have increased flexibility and interchangeability between handsets and/or headsets and the telephone terminals to which they connect, i.e. to be able to connect an earphone/microphone combination or headset unit to a different telephone terminal. To ensure that a signal with a suitable amplitude is transmitted from the headset via the telephone terminal to the destination (which could be another telephone unit), the necessary degree of amplification or attenuation between the telephone terminal and headset needs to be determined. If the transmitted signal has too low an amplitude then it will be too weak to hear easily at the destination. However, if the transmitted signal has too high an amplitude then it will be distorted at the destination. The signal amplitude from the telephone terminal must be optimized so that the signal sent to the headset can be heard clearly at the destination without clipping or distortion of the signal due to overdriving of the terminal. Clipping occurs due to the saturation of the microphone input circuit to the telephone terminal amplifier.

SUMMARY OF THE INVENTION

It is an object of the present invention to avoid or minimize one or more of the above disadvantages.

It is also an object of the present invention to provide a telephone interface that gives improved performance over headset and telephone terminal combinations which have no interface and no predetermined gain dedicated for that particular headset/telephone terminal combination.

It is a second objection of the present invention to provide improved performance over headset and telephone terminal units which have non-adaptive interface techniques.

It is a third object of the present invention to provide a device which can adapt a signal for improved transmission without the need for manual gain adjustment.

In general the present invention provides a means for adjusting amplification of a signal sent to a telephone terminal from a headset so as to ensure that a high amplitude signal is sent on from the telephone terminal to the destination without clipping of the signal.

For the purposes of this patent, optimum signal transfer occurs when a high amplitude signal is sent without clipping of the signal. To determine the maximum rms (root mean square) value a signal can have before clipping occurs the crest factor is used. The crest factor is the ratio of the peak value of a signal to the rms (root mean square) value of that signal. For speech, the typical crest factor is approximately five. Using this value of crest factor and the value of the signal amplitude which causes clipping (which is obtained by means of the present invention), the value of rms signal which will just avoid clipping can be determined. Hence the necessary value of gain or amplification to produce that rms signal can be set.

The substance of this invention is the use of a circuit which drives a test signal of varying amplitude into the microphone input of an audio input/output device such as a handset, to a telephone terminal. The sidetone coupling at the telephone terminal results in an attenuated form of the test signal returning, on the output from the telephone terminal that normally drives the speaker output of the audio input/output device. This sidetone is analyzed by a processor to determine at which amplitude of the test signal the sidetone is clipped. Once the test signal amplitude at which clipping begins has been recorded, the gain on the amplifier or attenuator in the interface is adjusted so that speech from the headset or earphone is just below the level where clipping occurs at volume levels corresponding to normal conversation.

Thus the present invention provides an adaptive telephone interface for use in a telephone apparatus comprising a telephone terminal including signal amplifier means, and an audio input/output device for said terminal, which telephone interface is disposable, in use between said terminal and said audio input/output device, and comprises a processor means formed and arranged for generating a test signal and sending this to the terminal at a plurality of different amplitudes; said processor means being further formed and arranged for monitoring the amplitude of an attenuated form of said test signal corresponding to said different amplitudes, which attenuated form is returned from said terminal by means of sidetone coupling, so as to detect the test signal amplitude at which clipping of at least part of said test signal occurs; said processor means being further formed and arranged for adjusting the amplification by the interface of a signal received from the audio input device, before sending it on to the terminal so as to avoid substantially clipping thereof by the terminal signal amplifier means in use of the telephone apparatus.

The present invention also provides means for adapting the gain of a telephone interface to ensure that optimum signal transfer occurs, which comprises means to generate a test signal and send it to a telephone terminal, means to receive the sidetone coupled signal from the telephone terminal, means to analyze the sidetone coupled signal received from the telephone terminal, and means to adjust the gain of the telephone interface in response to the analysis of the sidetone coupled signal.

In a further aspect the present invention provides a telephone apparatus comprising a telephone terminal including signal amplifier means, and an audio input/output device for said terminal, where is provided an adaptive telephone interface according to the present invention.

BRIEF DESCRIPTION OF THE DRAWINGS

For a better understanding of the above invention and to show how the same may be carried into effect, reference will now be made, by way of example, without loss of generality, to the accompany drawings in which:

FIG. 1 is a general view of a telephone apparatus provided with an adaptive telephone interface of the invention ; and FIG. 2 is a block circuit diagram of the apparatus of FIG. 1 showing the principal components of the interface.

DESCRIPTION OF THE PREFERRED EMBODIMENTS

FIG. 1 shows a telephone apparatus 1 comprising a telephone terminal 2 provided with a dialling keypad 3 and a handset 4. An adaptive telephone interface 5 is connected 6 into a terminal set socket 7 of the terminal 2 and is provided with a power supply 8 and the handset 4 is now connected 9 into the interface 5. (In the case of a terminal already provided with a dedicated headset socket then the handset may simply be left in place and the interface 5 connected into the headset socket). A headset 10 provided with a user wearable and operable control unit 11 is connected 12 to the interface via a releasable connector 13. The telephone terminal 2 and power supply unit 8 are connected 14, 15 to the telephone system and mains power supply (both not shown) respectively in the normal way.

As shown in FIG. 2 the interface 5 has a switch means 16 which is used to selectively connect the handset 4 and headset 10 with the associated interface circuitry to the terminal 2. The interface circuitry is connected to the switch means 16 via an isolation device 17.

The microphone (input device) of the headset 10 is connected 18 to an ADC (Analogue to Digital Converter) 19 for converting the analogue audio speech signal into a digital form suitable for processing by a microprocessor 20 and is then converted back into analogue form by a DAC (Digital to Analogue Converter) 21 for amplification as required by a PGA (programmable gain amplifier) 22 and an operational amplifier or power amplifier 23 for sending on to the terminal 2. Incoming voice signals and attenuated forms of the outgoing audio speech signals returned from the terminal 2 by sidetone coupling are similarly processed via a PGA 24 (which may have a fixed amplification or gain level), ADC 25 to bring them into a digital form for handling by the processor 20 before reconverting back into an analogue form by a DAC 26 for transmission 27 to the speaker or earphone (output device) of the headset 10. The processor 20 is also provided with non-volatile memory 28 for storing programs and reference data as required, and random access memory 29 in the normal way. The interface 5 also includes power supply circuitry 30 for supplying power to the above described components of the interface 5 and the headset 10 and its control unit 1.

In use of the interface a test signal is generated by the processor 20. This signal could be, for example, a sine wave. In this embodiment of the invention the test signal is in the form of sets of 64 cycles of a 500 Hz sine wave, the amplitude of which is increased after every 64-cycle signal. The processor 20 sends this test signal to the telephone terminal 2. The sidetone coupling in the telephone terminal 2 results in an attenuated form of the test signal being returned from the telephone terminal 2 to the processor 20. The processor 20 then analyses this attenuated form of the test signal. The analysis is performed using digital filters (or FFT i.e. fast fourier transforms) to select the fundamental frequency (500 Hz) of the signal and various harmonics of that frequency (e.g. 1000 Hz, second and 1500 Hz, third, harmonics). The processor 20 compares the amplitude of the fundamental frequency of the test signal with the relatively lower amplitude of the harmonics. When the amplitude of the test signal increases sufficiently, at a given point the test signal will be clipped. The ratio of the amplitude of the (unclipped) harmonics to the amplitude of the (clipped) fundamental frequency will then rise sharply. This point is used to determine a suitable value of gain for the PGA 22 of the interface 5. When the amplitude of the harmonic(s) reaches a certain fraction of the amplitude of the fundamental frequency then the processor uses the current value of the test signal amplitude to set the gain or attenuation required for optimum signal transfer. The gain or attenuation (positive or negative amplification) required is here conveniently set using the PGA Programmable Gain Amplifier or attenuator 22 but could also be effected by other suitable means e.g. digitally scaling the signal sample values.

The processor 20 monitors the attenuated test signal to determine whether or not the attenuated test signal has been clipped. If the attenuated test signal has not been clipped then the processor continues to monitor the attenuated test signal. If the attenuated test signal has been clipped then the value of the test signal amplitude which caused clipping of the signal is used to set the gain of the PGA 22.

Once the amplitude level at which clipping begins has been determined and the PGA gain set the test routine is programmed to self-terminate and will not run again. Where it is desired for any reason to permit "recalibration" to allow the gain setting to be adjusted if necessary e.g. for a new headset, then the test-routine may be restarted e.g. by a reset button or by a suitable control command which could be conveniently sent over the telephone system.

The test signal generation routine can be activated initially (i.e. for setting a PGA gain value for the first time) in a number of ways. In one embodiment of the present invention the signal is generated when power is applied to the device. In another embodiment the signal generation is triggered when the receiver on the telephone terminal is lifted. Another embodiment has the signal generated in response to a dedicated switch 5a on the interface 5 being depressed. In each case though the terminal needs to be placed on-line to the telephone system and as a result obtain a dialling tone or connect through to another terminal at which e.g. the handset is picked up but the receiving party stays silent, in order to obtain a sidetone coupling via the hybrid 4-line telephone system connection 14. It will incidentally be appreciated that where the dialling tone has a frequency in the region of 500 Hz and it is desired to work with this then the test signal should have a substantially different frequency e.g. 200 or 800 Hz.

It will be appreciated that various modifications may be made to the above described embodiment without departing from the scope of the present invention. Thus for example the entire test signal received by the processor 20 could be converted to the frequency domain using a technique such as Fast Fourier Transformation. However, the advantage of using filters is that the processing power needed is reduced. Filtering can even be achieved by hard logic or by using a state machine as the control processor.

Other embodiments of the present invention may use different methods of determining whether or not the test signal is clipping. One of these methods involves monitoring just the fundamental frequency, not the harmonics, to determine when the fundamental frequency saturates i.e. the returned attenuated form ceases to increase with increasing test signal amplitude due to clipping of the amplified form thereof by the terminal amplifier. Another method involves monitoring the ratio of the test signal amplitude to the amplitude of the sidetone to determine the point at which this ratio begins to rapidly increase due to clipping of the sidetone.

Of course various other test signal frequencies and/or durations thereof could be used and the amplitude could start high and decrease after every transmission thereof rather than start low and increase after every transmission thereof. It will moreover be appreciated that the processor is normally only required for running the test routine once to calibrate the gain level of the PGA. Nevertheless the process is conveniently also used for various other purposes in the course of normal everyday use e.g. to provide noise cancellation as described in our copending application No. PCT/GB95/00602.

I claim:

1. An adaptive telephone interface for use with a telephone apparatus, wherein said telephone apparatus comprises a telephone terminal including signal amplifier means, and an audio input/output device for said terminal, which telephone interface is disposable, in use between said terminal and said audio input/output device, and said telephone interface comprises:

a processor means formed and arranged for generating a test signal and sending said test signal to the terminal at a plurality of different amplitudes;

said processor means being further formed and arranged for monitoring the returned attenuated signal of said test signal from said terminal by means of sidetone coupling, so as to identify the test signal amplitude at which clipping of at least part of said test signal occurs;

said processor means being further formed and arranged for consequently adjusting the amplification of a signal received from the audio input/output device wherein the amplification of the signal received from the audio input/output device is adjusted by said telephone interface before sending the signal received from the audio input/output device on to the terminal so as to avoid over-clipping thereof by the terminal signal amplifier means; and said processor means being further formed and arranged for comparing said plurality of different amplitudes of the test signal sent to the terminal and the returned attenuated signal of said test signal, and detecting a change in the relative ratio resulting from clipping at least part of the returned attenuated form of the test signal.

2. A telephone interface according to claim 1 wherein said processor is formed and arranged for generating the test signal at a plurality of different amplitudes.

3. A telephone interface according to claim 1 wherein said processor is formed and arranged for generating the test signal at a high predetermined amplitude level and subjecting it to a plurality of different amplification levels by the interface for sending to the terminal at a plurality of different amplitudes.

4. A telephone interface according to claim 1 wherein said processor is formed and arranged for comparing the relative amplitudes of the test signal sent to the terminal and the returned attenuated form of the fundamental frequency of said test signal, and detecting an increase in the ratio of the amplitude of the test signal to that of the returned attenuated form of the fundamental frequency resulting from clipping of the latter.

5. A telephone interface according to claim 1 wherein said processor is formed and arranged for sending said test signal to the terminal at progressively increasing amplitudes and comparing the relative ratios for succeeding test signals with that for at least one preceding test signal.

6. An adaptive telephone interface according to claim 1 wherein said telephone interface is disposed external to said telephone terminal.

7. An adaptive telephone interface for use with a telephone apparatus wherein said apparatus comprises a telephone terminal including signal amplifier means, and an audio input/output device for said terminal, which telephone interface is disposable in use, between said terminal and said audio input/output device and said telephone interface comprising:

a processor means formed and arranged for generating a test signal and sending said test signal to the terminal at a plurality of different amplitudes;

said processor means being further formed and arranged for monitoring the retuned attenuated signal of said test signal from said terminal by means of sidetone coupling, so as to identify the test signal amplitude at which clipping of at least part of said test signal occurs;

said processor means being further formed and arranged for consequentially adjusting the amplification of a signal received from the audio input/output device, wherein the amplification of the signal received from the audio input/output device is adjusted by said telephone interface before sending the signal received from the audio input/output device on to the terminal so as to avoid over-clipping thereof by the terminal signal amplifier means; and said processor means being further formed and arranged for comparing said plurality of different amplitudes of the returned attenuated forms of the fundamental frequency of said test signal sent to the terminal and at least one harmonic signal of said test signal, and detecting a reduction in the ratio of the amplitude of the turned attenuated form of the fundamental frequency to that of the retuned attenuated form of said at least one harmonic, resulting from clipping of the returned attenuated form of said fundamental frequency.

8. A telephone interface according to claim 7 wherein said processor is formed and arranged for separating said fundamental frequency and said at least one harmonic from the returned attenuated form of the test signal prior to determining the relative ratio of their amplitudes.

9. A telephone interface according to claim 7, wherein said processor is formed and arranged for generating the test signal at a plurality of different amplitudes.

10. A telephone interface according to claim 7, wherein said processor is formed and arranged for generating the test signal at a high predetermined amplitude level and subjecting it to a plurality of different amplification levels by the interface for sending to the terminal at a plurality of different amplitudes.

11. A telephone interface according to claim 7, wherein said processor is formed and arranged for comparing the relative amplitudes of the test signal sent to the terminal and the returned attenuated form of the fundamental frequency of said test signal, and detecting an increase in the ratio of the amplitude of the test signal to that of the returned attenuated form of the fundamental frequency resulting from clipping of the latter.

12. A telephone interface according to claim 7, wherein said processor is formed and arranged or sending said test signal to the terminal at progressively increasing amplitudes and comparing the relative ratios for succeeding test signals with that for at least one preceding test signal.

13. An adaptive telephone interface according to claim 7 wherein said telephone interface is disposed external to said telephone terminal.

14. A telephone apparatus comprising a telephone terminal including signal amplifier means, and an audio input/output device for said terminal, wherein is provided an adaptive telephone interface between said terminal and said audio input/output device, said adaptive telephone interface comprising;

a processor means formed and arranged for generating a test signal and sending said test signal to the terminal at a plurality of different amplitudes;

said processor means being further formed and arranged for monitoring the returned attenuated signal of said test signal from said terminal by means of sidetone coupling, so as to identify the test signal amplitude at which clipping of at least part of said test signal occurs;

said processor means being formed and arranged for consequentially adjusting the amplification of a signal received from the audio input/output device, before sending the signal received from the audio input/output device on to the terminal so as to avoid over-clipping thereof by the terminal signal amplifier means; and said processor means being further formed and arranged for comparing said plurality of different amplitudes of the test signal sent to the terminal and returned attenuated signal of said test signal; and detecting a change in the relative ratio resulting from clipping of at least part of the returned attenuate form of test signal.

15. A telephone apparatus according to claim 14 wherein is used an audio input/output device comprising a telephone headset.

16. A telephone apparatus according to claim 14 wherein is used an audio input/output device comprising a telephone handset.

17. A telephone apparatus comprising a telephone terminal including signal amplifier means, and an audio input/output device for said terminal, wherein is provided an adaptive telephone interface between said terminal and said input/output deice, said adaptive telephone interface comprising;

a processor means formed and arranged for generating a test signal and sending said test signal to the terminal at a plurality of different amplitudes;

said processor means being further formed and arranged for monitoring the returned attenuated signal of said test signal from sad terminal by means of sidetone coupling, so as to identify the test signal amplitude at which clipping of at least part of said test signal occurs;

said processor means being further formed and arranged for consequentially adjusting the amplification of a signal received from the audio input/output device wherein the amplification of the signal received from the audio input/output device is adjusted by said telephone interface before sending the signal received from the audio input/output device on to the terminal so as to avoid over-clipping thereof by the terminal signal amplifier means; and said processor means being further formed and arranged for comparing said plurality of different amplitudes of the returned attenuated forms of the fundamental frequency of said test signal sent to the terminal and at least one harmonic signal of said test signal, and detecting a reduction in the ratio of the amplitude of the returned attenuated form of the fundamental frequency to that of the returned attenuated form of said at least one harmonic, resulting from clipping of the returned attenuated form of said fundamental frequency.

18. A telephone apparatus according to claim 17 wherein is used an audio input/output device comprising a telephone headset.

19. A telephone apparatus according to claim 17 wherein is used an audio input/output device comprising a telephone handset.

20. An adaptive telephone interface for use with a telephone apparatus, wherein said telephone apparatus comprises a telephone terminal including signal amplifier means and an audio input/output device for said terminal, said interface comprising:

processor means formed and arranged for generating a test signal and sending said test signal to the terminal at a plurality of different amplitudes;

said processor means being further formed and arranged for monitoring the returned attenuated signal of said test signal from said terminal by means of sidetone coupling, so as to identify the test signal amplitude at which clipping of at least part of said test signal occurs;

said processor means being further formed and arranged for consequentially adjusting the amplification of a signal received from the audio input/output device wherein the amplification of the signal received from the audio input/output device is adjusted by said telephone interface before sending the signal received from the audio input/output device on to the terminal so as to avoid over-clipping thereof by said signal amplifier means; and said processor means being further formed and arranged for comparing said plurality of different amplitudes of the test signal sent to the terminal and the returned attenuated form of the fundamental frequency of said test signal, and detecting an increase in the ratio of the amplitude of said test signal to that of the returned attenuated form of the fundamental frequency of test signal resulting from clipping of the latter.

21. A telephone interface according to claim 20, wherein said processor is formed and arranged for sending said test signal to the terminal at progressively increasing amplitudes and comparing the relative ratios for succeeding test signals with that for at least one preceding test signal.

* * * * *

UNITED STATES PATENT AND TRADEMARK OFFICE
CERTIFICATE OF CORRECTION

PATENT NO. : 5,896,451
DATED : April 20, 1999
INVENTOR(S) : Deas

It is certified that error appears in the above-identified patent and that said Letters Patent is hereby corrected as shown below:

Column 6, line 2, "retuned" should read --returned--; line 21, "turned" should read --returned--; line 22, "retuned" should read --returned--.

Column 7, line 30, "sad" should read --said--; line 23, "deice" should read --device--.

Signed and Sealed this

Nineteenth Day of October, 1999

*Attest:*

Q. TODD DICKINSON

*Attesting Officer*     *Acting Commissioner of Patents and Trademarks*